United States Patent
Yamasaki et al.

(10) Patent No.: US 8,742,424 B2
(45) Date of Patent: Jun. 3, 2014

(54) SHIFT REGISTER AND DISPLAY APPARATUS

(75) Inventors: Chikao Yamasaki, Osaka (JP); Tetsuo Kikuchi, Osaka (JP); Shinya Tanaka, Osaka (JP); Junya Shimada, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 99 days.

(21) Appl. No.: 13/511,661

(22) PCT Filed: Jul. 9, 2010

(86) PCT No.: PCT/JP2010/061713
§ 371 (c)(1),
(2), (4) Date: Jun. 8, 2012

(87) PCT Pub. No.: WO2011/065055
PCT Pub. Date: Jun. 3, 2011

(65) Prior Publication Data
US 2012/0241747 A1  Sep. 27, 2012

(30) Foreign Application Priority Data
Nov. 25, 2009  (JP) .................. 2009-267938

(51) Int. Cl.
*H01L 29/04*  (2006.01)
(52) U.S. Cl.
USPC ................. 257/72; 257/59; 257/E29.151
(58) Field of Classification Search
USPC ............... 257/59, 72, 291, 292, 443, E29.151
See application file for complete search history.

(56) References Cited

U.S. PATENT DOCUMENTS

| | | | |
|---|---|---|---|
| 6,891,196 B2 * | 5/2005 | Tanaka et al. | .................. 257/72 |
| 2004/0173795 A1 | 9/2004 | Moon et al. | |
| 2005/0092994 A1 | 5/2005 | Ishige | |
| 2006/0049404 A1 | 3/2006 | Park et al. | |
| 2010/0238156 A1 | 9/2010 | Iwamoto et al. | |

FOREIGN PATENT DOCUMENTS

| | | |
|---|---|---|
| JP | 08-298325 A | 11/1996 |
| JP | 2004-274050 A | 9/2004 |
| JP | 2005-136017 A | 5/2005 |
| JP | 2006-080472 A | 3/2006 |
| JP | 2008-089646 A | 4/2008 |
| JP | 2009-145716 A | 7/2009 |
| WO | 20091093352 A1 | 7/2009 |

OTHER PUBLICATIONS

Official Communication issued in International Patent Application No. PCT/JP2010/061713, mailed on Sep. 28, 2010.

* cited by examiner

*Primary Examiner* — Quoc Hoang
(74) *Attorney, Agent, or Firm* — Keating & Bennett, LLP

(57) ABSTRACT

The present invention provides a shift register and a display device, each of which operates stably. The present invention relate to a shift register, comprising a thin-film transistor which includes a source electrode, a drain electrode, and a gate electrode, the thin-film transistor being a bottom gate thin-film transistor which includes a comb-shaped source/drain structure, the gate electrode being provided with at least one of a cut and an opening in at least one of a region overlapping with the source electrode and a region overlapping with the drain electrode.

10 Claims, 12 Drawing Sheets

SHIFT REGISTER AND DISPLAY APPARATUS

TECHNICAL FIELD

The present invention relates to a shift register and a display device. Specifically, the present invention relates to a shift register suitable for a drive circuit of a display device and a display device including the shift register.

BACKGROUND ART

An active matrix display device creates images by writing a voltage in accordance with display data into pixels selected for each line individually and sequentially from pixels arranged in a matrix pattern. In order to select pixels for each line individually and sequentially, a shift register allowing an output signal (scanning signal) to sequentially shift depending on a clock signal is used as a gate driver. If dot sequential drive is performed, a similar shift register is formed in a source driver.

Further, in a liquid crystal display device and the like, a gate driver may be integrally formed in a production process of a thin-film transistor (TFT) in a pixel. For example, when a TFT in a pixel is made of amorphous silicon, it is preferable that a shift register functioning as a gate driver be also made of amorphous silicon for a reduction in production costs. Thus, in recent years, the formation of a gate driver on a panel, that is, gate monolithic fabrication, has been developed. The term "gate monolithic fabrication" is also associated with the terms such as "gate driver-free", "built-in gate driver in panel", and "gate in panel".

A TFT made of amorphous silicon (hereinafter, also referred to as a-Si TFT) has low mobility, and therefore needs a high driving voltage. Accordingly, particularly in a large-sized display device, a high voltage needs to be supplied to a scanning signal line in order to drive an a-Si TFT in a pixel. Therefore, the channel width of the a-Si TFT in a gate driver is set to be large, and for example, it is set in mm order or cm order in the whole TFT.

As such an a-Si TFT for a gate driver, an a-Si TFT including a combination of a U-shaped source electrode line and an I-shaped drain electrode line is disclosed (see, for example, Patent Literature 1).

A technology for forming a TFT for an optical sensor in a liquid crystal display device is disclosed (see, for example, Patent Literature 2).

CITATION LIST

Patent Literature

Patent Literature 1: JP 2004-274050 A
Patent Literature 2: JP 2009-145716 A

SUMMARY OF INVENTION

Technical Problem

However, when a shift register is formed using a TFT having a conventional comb-shaped source/drain structure described in Patent Literature 1, display quality of a display device including such a shift register may be deteriorated. In addition, operation margin of the shift register may be reduced and the shift register may malfunction in operation.

FIG. 10 shows an exemplary configuration of a shift register that is gate-monolithically fabricated.

A shift register 100 includes a plurality of unit circuits 110 ( . . . , SRn−1, SRn, SRn+1, . . . ). Each unit circuit 110 is provided with input terminals INa and INb, an output terminal OUT, a power supply terminal VSS, and a clock terminal CK.

The output signals OUT are sent out (fed into corresponding scanning signal lines) from the respective unit circuits 110 as output signals SROUT1 to SROUTn, and each output signal is simultaneously fed into an input terminal INa of the next unit circuit 110 and an input terminal INb of the previous unit circuit 110. A low level potential VSS which is a low-level power source voltage of each unit circuit 110 is fed into the power supply terminal VSS. A clock signal CK1 is fed into a clock terminal CK of an odd-numbered unit circuit 110 and a clock signal CK2 is fed into a clock terminal CK of an even-numbered unit circuit 110. As shown in FIG. 12, the clock signals CK1 and CK2 have such phases that their high level periods do not overlap each other.

FIG. 11 shows an exemplary configuration of each unit circuit of the shift register 100.

The each unit circuit 110 is provided with transistors 111a to 111d which are n-channel TFTs and capacitance 112.

In the transistor 111a, the gate and the drain are connected to the input terminal INa, and the source is connected to the gate of the transistor 111d. In the transistor 111d, the drain is connected to the clock terminal CK, and the source is connected to the output terminal OUT. That is, the transistor 111d functions as a transmission gate and controls the passage and cutout of a clock signal that is fed into the clock terminal CK. The capacitance 112 is connected between the gate of the transistor 111d and the source of the transistor 111d. A node with the same potential as the gate of the transistor 111d is referred to as netA.

In the transistor 111b, the gate is connected to the input terminal INb, the drain is connected to the node netA, and the source is connected to the power supply terminal VSS. In the transistor 111c, the gate is connected to the input terminal INb, the drain is connected to the output terminal OUT, and the source is connected to the power supply terminal VSS.

Operation of the shift register 100 is described below with reference to FIG. 12.

The transistors 111c and 111d each are in a high impedance state until a shift pulse is fed into the input terminal INa. Therefore, in such a period, a low level voltage is held in the output terminal OUT.

When a gate pulse of an output signal SROUT (OUTn−1 in FIG. 12) sent out from the previous unit circuit, that is, a shift pulse, is fed into the input terminal INa, a period for generating an output pulse starts in the output terminal OUT, and the transistor 111a is turned ON to start the charge of the capacitance 112. The charge of the capacitance 112 increases a potential of the node netA, which allows the transistor 111d to be turned ON. This causes a clock signal fed through the clock terminal CK to appear in the drain of the transistor 111d. At the instant when the clock pulse is fed into the clock terminal CK, the potential of the node netA is boosted due to a bootstrap effect of the capacitance 112. As a result, the incoming clock pulse is transferred to the output terminal OUT of each unit circuit and is sent out from the output terminal OUT as a gate pulse (here, a pulse of an output signal SROUTn).

After the completion of the feeding of the gate pulse into the input terminal INa, the transistor 111a is turned OFF. Then, in order to release charge retention caused by floating of the node netA and floating of the output terminals OUT of the unit circuits, the transistors 111b and 111c are turned ON by a reset pulse fed into the input terminal INb, and the node netA and the output terminal OUT are connected to the power supply voltage VSS. Thereafter, the transistor 111*d* is turned OFF. After the completion of the feeding of the reset pulse, the period of generation of the output pulse from the output terminal OUT ends and the period of retention of a low level voltage starts again.

Thus, the gate pulse is sequentially fed into each gate line.

The structures of these transistors are described. The transistors 111*a* to 111*d* each have a comb-shaped source/drain structure as shown in FIGS. 13 and 14. That is, a source electrode 118 and a drain electrode 119 are disposed facing each other on a gate electrode 114, and a tooth of a comb of the source electrode 118 and a tooth of a comb of the drain electrode 119 are alternately arranged.

As shown in FIG. 15, the transistors 111*a* to 111*d* are bottom gate TFTs, and each include the gate electrode 114 disposed on a substrate (not shown), a gate insulating film 115 disposed on the electrode 114, an i layer 116 (semiconductor active layer) disposed on the film 115, an n+ layer 117 (impurity diffused layer) disposed on the layer 116, the source electrode 118 disposed on the layer 117, and the drain electrode 119 disposed on the electrode 118.

However, in the shift register 100 as shown in FIG. 16, even when the transistor 111*d* is in an OFF state, the potential of the node netA may undulate, that is, the potential may be variable. This is because, in the transistor 111*d*, parasitic capacitance 113 is generated at a portion where the gate electrode 114 overlaps the drain electrode 119, and the potential of the node netA is affected by change in potential of a clock signal CK even when the transistor 111*d* is in an OFF state. As a result, a leakage current may generate in the transistor 111*d*.

Further, in the shift register 100, the transistors 111*c* and 111*d* each are in a high impedance state in a period where the output terminal OUT holds a low level voltage, whereby the output terminal OUT is turned into a floating state. Accordingly, such an output terminal OUT may not hold a low level voltage because of noise transmitted by, for example, cross coupling of a scanning signal line and a source signal line. In order to prevent such a problem, sink-down transistors are formed. The transistors connect the output terminal OUT with the low level power supply voltage VSS during the (voltage) low level holding period.

In the low-level holding period, the transistor 111*b* is also in a high impedance state, and therefore, the node netA is turned into a floating state. Therefore, in order to prevent the transistor 111*d* from leaking, the sink-down transistors for connecting the node netA with the low level power supply voltage VSS in the low-level holding period may be formed.

However, such sink-down transistors each also have a comb-shaped source/drain structure shown in FIGS. 13 and 14, and therefore, the parasitic capacitance may be generated between the source electrode 118 and the drain electrode 119. Therefore, the sink-down transistors may not operate with good performance.

In addition, in the transistor 111*a*, if the parasitic capacitance between the gate and drain is large, the initial rise in the voltage of the first node netA may be slow at the time of the application of a gate voltage Vgd, and the voltage of the node netA does not completely rise before a bootstrap effect is exerted, which may result in insufficient output. Further, even if the transistor 111*a* is in an OFF state at the time of sending an output signal, discharge occurs through the parasitic capacitance between the gate and drain and the parasitic capacitance between the gate and source, which may result in a voltage drop of the node netA.

The problems described above may cause deterioration of display quality of a display device including a shift register that is gate-monolithically fabricated, reduction in operation margin of the shift register, and malfunctions in operation in the shift register.

The present invention has been made in view of the above-mentioned state of the art, and an object of the present invention is to provide a shift register and a display device, each of which can operate stably.

Solution to Problem

The present inventors made various investigations on a shift register which can operate stably, and noted a structure of a TFT forming the shift register. The present inventors found that in a bottom gate TFT having a comb-shaped source/drain structure, a reduction in parasitic capacitance can be achieved by a gate electrode provided with at least one of a cut and an opening in at least one of a region overlapping with a source electrode and a region overlapping with a drain electrode. Thereby the above-described problems have been solved, leading to completion of the present invention.

That is, the present invention relates to a shift register, comprising a thin-film transistor which includes a source electrode, a drain electrode, and a gate electrode, the thin-film transistor being a bottom gate thin-film transistor which includes a comb-shaped source/drain structure, the gate electrode being provided with at least one of a cut and an opening in at least one of a region overlapping with the source electrode and a region overlapping with the drain electrode.

The configuration of the shift transistor of the present invention is not especially limited by other components as long as it essentially includes such components.

Preferable embodiments of the shift register of the present invention are described in more detail below.

The gate electrode preferably has the cut for suppressing parasitic capacitance more effectively. The gate electrode preferably has the opening for reducing parasitic capacitance and suppressing an increase in wiring resistance.

The shift register preferably includes a clock terminal into which a clock signal is fed and an output terminal through which an output signal is sent out, and the shift register includes an output transistor disposed between the clock terminal and the output terminal, the output transistor switching passage and cutout of the clock signal according to a gate potential.

The thin-film transistor is preferably the output transistor, and the at least one of a cut and an opening is formed in a region overlapping with one electrode connected to the clock terminal, the one electrode being selected from the source electrode and the drain electrode. Thus, the potential of a node which is connected to a gate of the output transistor can be suppressed from undulating in response to change in potential of a clock signal. Accordingly, the effect of the present invention can be particularly suitably achieved.

In this case, the gate electrode is preferably provided with no cut and no opening in a region overlapping with one electrode selected from the source electrode and the drain electrode, the one electrode being connected to the output terminal. Thereby, a bootstrap effect can be improved.

The thin-film transistor may be a transistor for applying a low level voltage to the output terminal at times other than a time of sending of the output signal, and the at least one of a cut and an opening is formed in a region overlapping with the source electrode and a region overlapping with the drain electrode.

The thin-film transistor may be a transistor (sink-down transistor) for applying a low level voltage to a node connected to a gate of the output transistor during a period other than a period for turning the output transistor ON, and the at least one of a cut and an opening is formed in a region overlapping with the source electrode and a region overlapping with the drain electrode.

The shift register may include a first transistor in which source or drain is connected to the gate of the output transistor, the thin-film transistor is a transistor for applying a low level voltage to a node connected to a gate of the first transistor during a period for turning the output transistor ON, and the at least one of a cut and an opening is formed in a region overlapping with the source electrode and a region overlapping with the drain electrode.

Thereby, malfunctions in operation due to the parasitic capacitance can be effectively suppressed in the sink-down transistors.

The shift register may include a cascade connection of a plurality of unit circuits and an input terminal into which a start pulse is fed or an output signal is fed from the previous circuit, the thin-film transistor is a transistor in which one of a source and a drain is connected to the gate of the output transistor and a gate and the other of the source and the drain are connected to the input terminal, the at least one of a cut and an opening is formed in a region overlapping with the source electrode and a region overlapping with the drain electrode. Thereby, insufficient output caused by slow initial rise in the voltage of a node that is connected to a gate of an output transistor and discharge in the transistor can be suppressed.

The thin-film transistor is preferably formed of amorphous silicon. Thereby, the yield of the shift register can be remarkably increased.

The present invention also relates to a display device, comprising:
a plurality of pixel circuits arranged in a matrix pattern; and
a driver including the shift register according to any one of the present invention. Thereby, the display device of the present invention includes the shift register that can operate stably in a driver, which can result in an increase in yield and a reduction in costs.

Advantageous Effects of Invention

The shift register and the display device of the present invention can operate stably.

DESCRIPTION OF EMBODIMENTS

Figure 1:
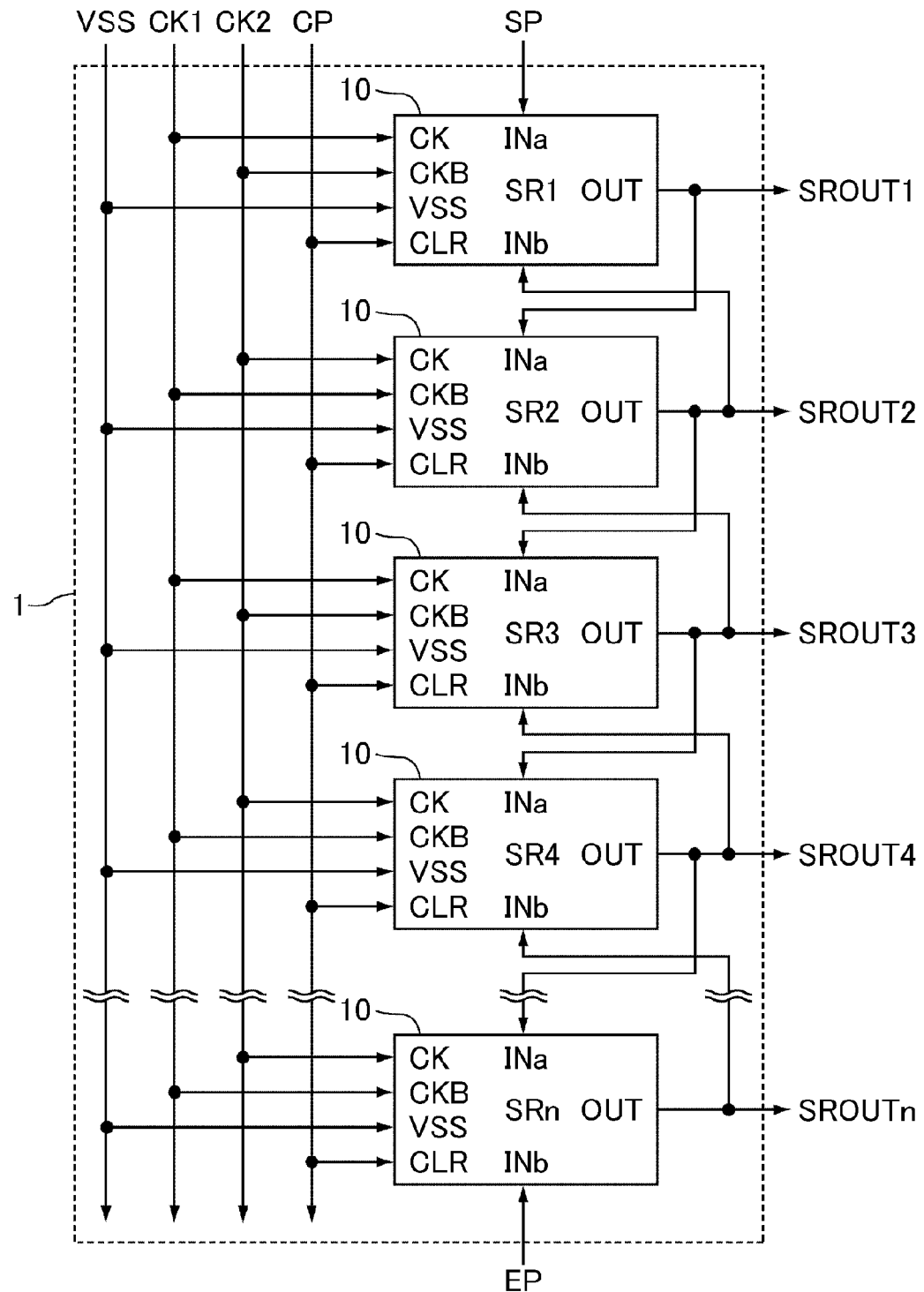
FIG. 1 is a block diagram showing a configuration of a shift register of Embodiment 1.

The present invention will be mentioned in more detail referring to the drawings in the following embodiments, but is not limited to these embodiments.

In the following description, a high-level potential is referred to as "VGH", a low level potential is referred to as "VGL" unless otherwise noted, and the potential of the power supply terminal VSS is equal to a low level potential VGL. The name of a signal fed or sent out through a terminal in a circuit is the same as that of the terminal. For example, a signal fed through a clock terminal CK is named a clock signal CK. Further, n and m each are an integer of 2 or more, i is an integer of 1 or more and n or less, and j is an integer of 1 or more and m or less.

Embodiment 1

A shift register 1 is constituted by cascade-connecting n unit circuits 10 as shown in FIG. 1. Each unit circuit 10 includes input terminals INa and INb, clock terminals CK and CKB, a power supply terminal VSS, a clear terminal CLR, and an output terminal OUT.

A start pulse SP, an end pulse EP, clock signals CK1 and CK2 of two phases, a clear pulse CP, and a low level potential VSS are fed into the shift register 1 from outside. The start pulse SP is fed into the input terminal INa of the first unit circuit 10. The end pulse EP is fed into the input terminal INb of an n-th unit circuit 10. The clock signal CK1 is fed into the clock terminals CK of the odd-numbered unit circuits 10 and clock terminals CKB of the even-numbered unit circuits 10. The clock signal CK2 is fed into the clock terminals CK of the even-numbered unit circuits 10 and the clock terminals CKB of the odd-numbered unit circuits 10. The clear pulse CP is fed into the clear terminals CLR of all the unit circuits 10. The low level potential VSS is fed into the power supply terminals VSS of all the unit circuits 10. Output signals OUT of the unit circuits 10 are sent out to the outside as the respective output signals SROUT1 to SROUTn, and each of the output signals is simultaneously fed into the input terminal INa of the next unit circuit 10 and the input terminal INb of the previous unit circuit 10.

Figure 2:
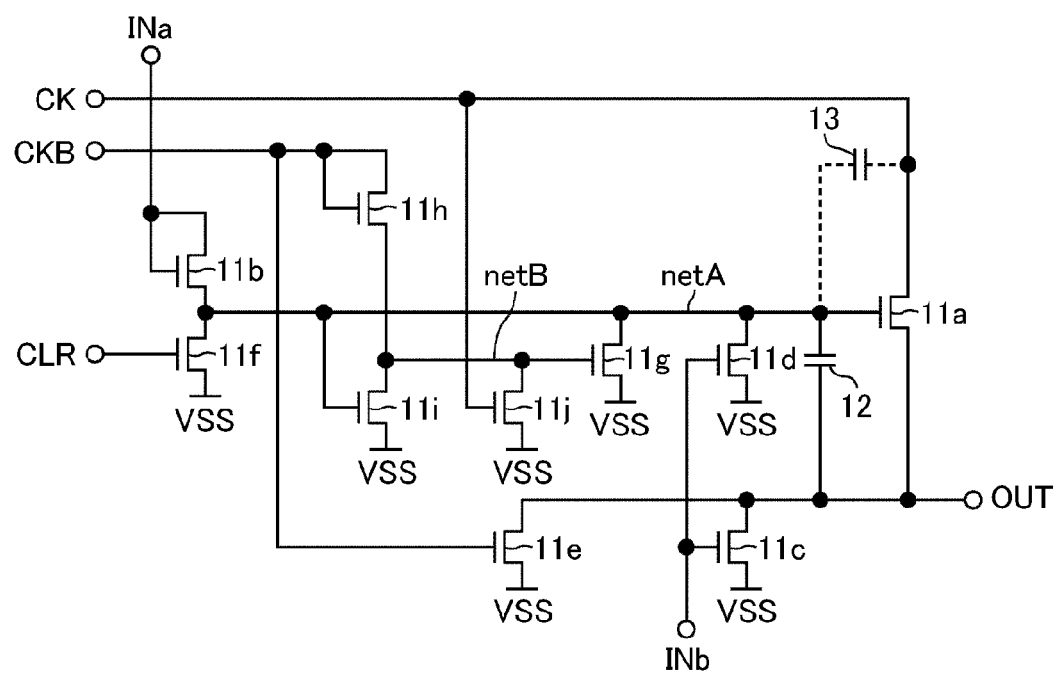
FIG. 2 is a circuit diagram of a unit circuit included in the shift register of Embodiment 1.

As shown in FIG. 2, each unit circuit 10 includes transistors 11a to 11j which are n-channel TFTs, and capacitance 12. The drain of the transistor 11a is connected to the clock terminal CK, and the source is connected to the output terminal OUT. The drain and the gate of the transistor 11b are connected to the input terminal INa, and the source of the transistor 11b is connected to the gate of the transistor 11a. The capacitance 12 is formed between the gate and the source of the transistor 11a. The drain of the transistor 11c is connected to the output terminal OUT, and the drain of the transistor 11d is connected to the gate of the transistor 11a. The gate of the transistor 11c and the gate of the transistor 11d are connected to the input terminal INb, and the source of the transistor 11c and the source of the transistor 11d are connected to the power supply terminal VSS.

The drain of the transistor 11e is connected to the output terminal OUT, the gate of the transistor 11e is connected to the clock terminal CKB, and the source of the transistor 11e is connected to the power supply terminal VSS. The drain of the transistor 11f is connected to the gate of the transistor 11a, the gate of the transistor 11f is connected to the clear terminal, and the source of the transistor 11f is connected to the power supply terminal VSS.

The drain of the transistor 11g is connected to the gate of the transistor 11a, and the source of the transistor 11g is connected to the power supply terminal VSS. The source of the transistor 11h, the drain of the transistor 11i, and the drain of the transistor 11j are connected to the gate of the transistor 11g. The drain and the gate of the transistor 11h are connected to the clock terminal CKB. The gate of the transistor 11i is connected to the gate of the transistor 11a, and the source of the transistor 11i is connected to the power supply terminal VSS. The gate of the transistor 11j is connected to the clock terminal CK, and the source of the transistor 11j is connected to the power supply terminal VSS.

The transistor 11a is formed between the clock terminal CK and the output terminal OUT, and functions as an output transistor (transmission gate) for switching passage and cut-out of a clock signal depending on the gate potential thereof. The gate of the transistor 11a is capacitively coupled with a conductive terminal (source) on the output terminal OUT side. Therefore, in a period in which the transistor 11a is in an ON state and the clock signal CK is in a high level, the gate potential of the transistor 11a is higher than the high-level potential of the clock signal CK. Hereinafter, a node to which the gate of the transistor 11a is connected is referred to as netA.

Figure 3:
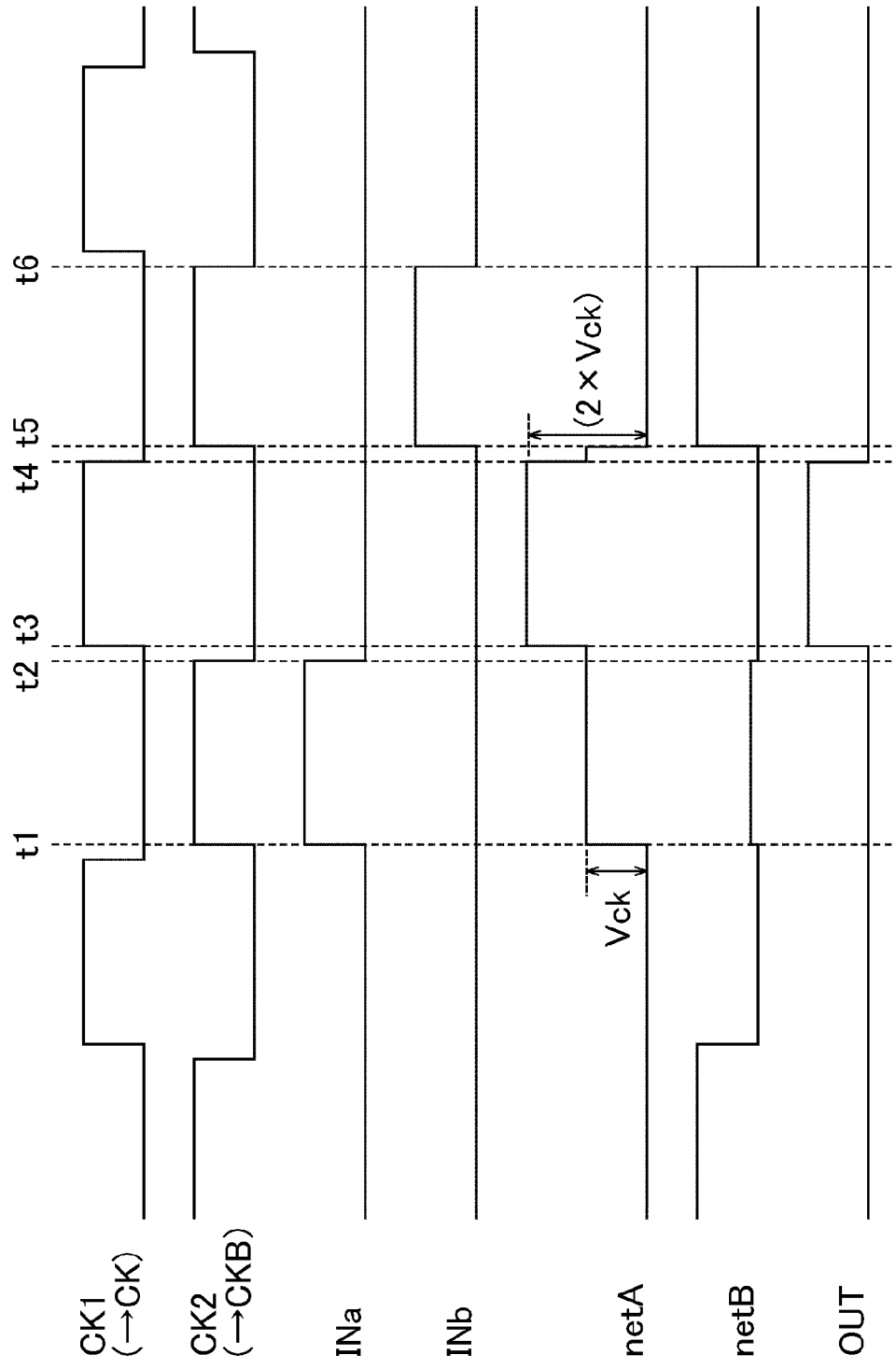
FIG. 3 is a timing chart of the shift register of Embodiment 1.

FIG. 3 shows a timing chart of the shift register 1.

FIG. 3 shows voltage changes of input/output signals of an odd-numbered unit circuit 10 and the node netA. A clock signal CK1 is fed into each of the odd-numbered unit circuits 10 through the clock terminal CK, and a clock signal CK2 is fed into each of the odd-numbered unit circuits 10 through the clock terminal CKB. The clock signal CK1 has a high potential period slightly shorter than one-half of the cycle of the clock signal CK1. The clock signal CK2 is delayed by half the cycle of the clock signal CK1. That is, the clock signals CK1 and CK2 have such phases that their high level periods do not overlap with each other.

Before the start of shift operation, a start pulse SP (not shown) is in high level during the same period as the high potential period of the clock signal CK1. After the end of the shift operation, an end pulse (not shown) is in high level during the same period as the high potential period of the clock signal CK1.

At the time t1, the input signal INa (output signal sent out of the previous unit circuit 10) changes from low level to high level, and thereby the potential of the node netA also changes to high level via the diode-connected transistor 11b. As a result, the transistor 11a is turned ON.

At the time t2, the input signal INa changes to low level, and thereby the transistor 11b is turned OFF and the node netA is turned into a floating state, but the transistor 11a is held in an ON state.

At the time t3, the clock signal CK (clock signal CK1) changes from low level to high level, and thereby the potential of the node netA changes to a level about twice as large as the amplitude Vck (=VGH−VGL) of the clock signal by a boot-strap effect. The clock signal CK passes through the transistor 11a without voltage drop because the gate potential of the transistor 11a is sufficiently high.

In the period from the time t3 at which the clock signal CK changes to high level to the time t4, the potential of the node netA changes to a level about twice as large as Vck and the output signal OUT changes to high level.

At the time t4, the potential of the node netA changes to high level and the output signal OUT changes to low level.

At the time t5, the input signal INb (output signal sent out of the next unit circuit 10) changes from low level to high level, and thereby the transistors 11c and 11d are turned ON. In the period where the transistor 11c is in an ON state, a low level potential is applied to the output terminal OUT. Further, when the transistor 11d is turned ON, the potential of the node netA changes to low level and the transistor 11a is turned OFF.

At the time t6, the input signal INb changes to low level, the transistors 11c and 11d are turned OFF. At this time, the node netA is turned into a floating state, but the transistor 11a is held in an OFF state. Ideally, the transistor 11a is held in an OFF state and the output signal OUT is held in low level until the input signal INa again changes to high level.

The transistor 11e is turned ON when the clock signal CKB (clock signal CK2) is in high level. Every time the clock signal CKB changes to high level, a low level potential is applied to the output terminal OUT. Thus, the transistor 11e operates to repeatedly set the output terminal OUT at low level to stabilize the output signal OUT.

The transistor 11f is turned ON when a clear signal CLR (clear pulse CP) is in high level. At this time, a low level potential is applied to the node netA. Thus, the transistor 11f operates to initialize the potential of the node netA to low level.

The transistor 11h is turned ON when the clock signal CKB (clock signal CK2) is in high level. At this time, a high level potential of the clock signal CKB is applied to a node netB. The transistor 11i is turned ON when the potential of the node netA is not lower than Vck. At this time, a low level potential is applied to the node netB. The transistor 11j is turned ON when the clock signal CK (clock signal CK1) is in high level. At this time, a low level potential is applied to the node netB.

Therefore, the potential of the node netB is in high level when the clock signal CK is in low level, the clock signal CKB is in high level, and the potential of the node netA is in low level. The potential of the node netB is in low level in the rest of the time. The transistor 11g is turned ON when the potential of the node netB is in high level. At this time, a low level potential is applied to the node netA. Thus, the transistors 11g to 11j each operate to hold a low level potential applied to the node netA.

As described above, the transistors 11c and 11e are transistors (sink-down transistors) that operate to apply a low level voltage to the output terminal OUT during a period other than the period for sending out the output signal OUT.

The transistors 11d, 11f to 11h, and 11j are transistors (sink-down transistors) that operate to apply a low level voltage to the node netA that is connected to the gate of the transistor 11a, during a period other than the period for turning the transistor 11a (output transistor) ON.

The transistor 11i is turned ON when the input signal INa is fed, and operates to apply a low level voltage to the node netB. Therefore, the transistor 11g is not turned ON during such a period, and the input signal INa can be applied to the node netA. Thus, the transistor 11*i* is a transistor (sink-down transistor) which operates to apply a low level voltage to the node netB that is connected to the gate of the transistor 11*g*, during a period for turning the transistor 11*a* (output transistor) ON.

Figure 4:
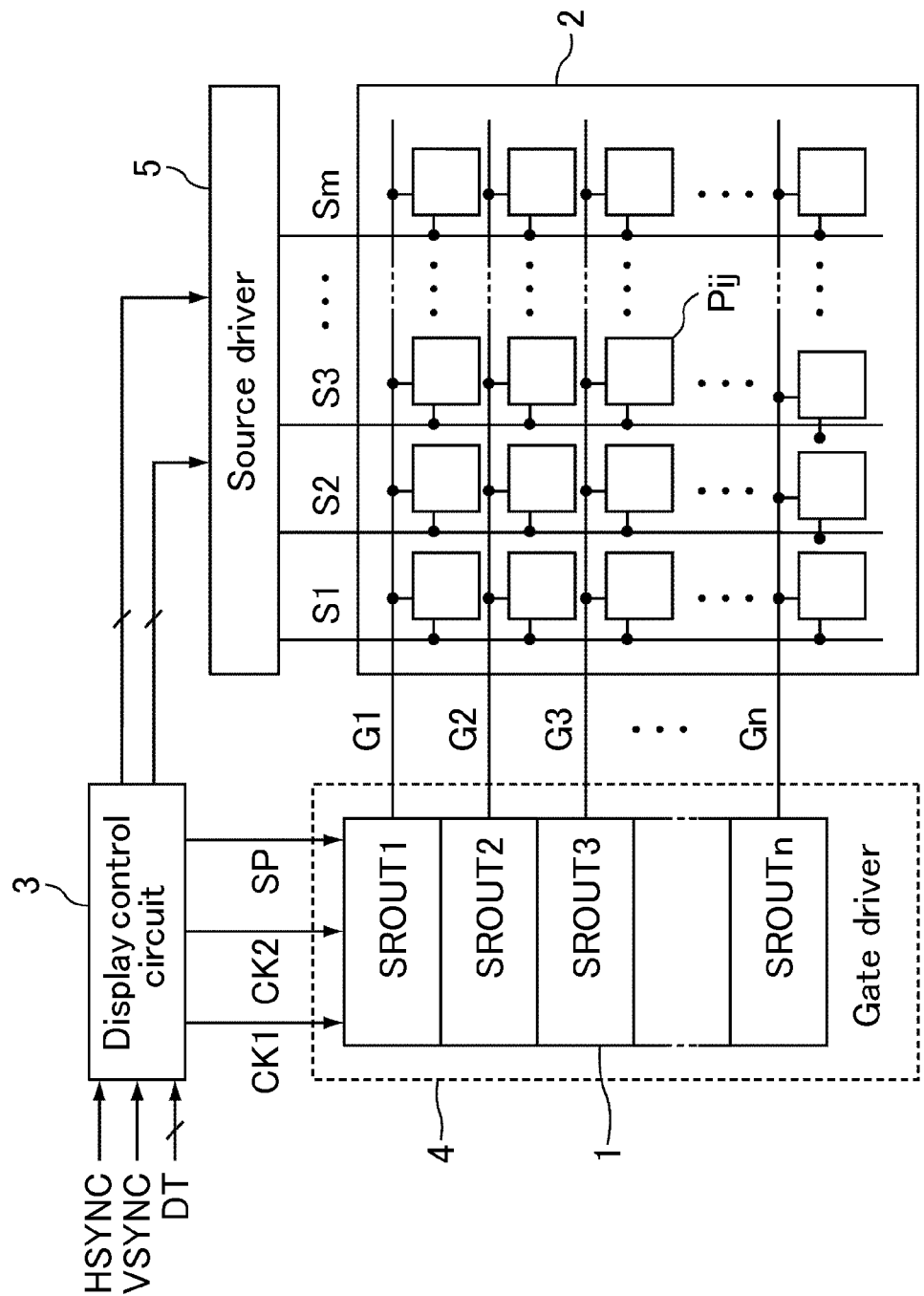
FIG. 4 is a block diagram showing a configuration of a liquid crystal display device of Embodiment 1.

The shift register 1 is used for, for example, a drive circuit of a display device. FIG. 4 is a block diagram showing a configuration of a liquid crystal display device including the shift transistor 1.

As shown in FIG. 4, the liquid crystal display device of the present embodiment is an active matrix display device, and includes a pixel array 2, a display-control circuit 3, a gate driver 4, and a source driver 5. In the present embodiment, the shift register 1 is used as the gate driver 4.

The pixel array 2 and the gate driver 4 are formed on a transparent insulating substrate such as a glass substrate. The source driver 5 is formed in a flexible printed circuit board. The display-control circuit 102 is formed in a control substrate. Thus, the gate driver 4 is monolithically formed on the substrate together with the pixel array 2. The gate driver 4 may include all gate drivers of "gate monolithic", "gate driver-free", "built-in gate driver in panel", and "gate in panel".

The pixel array 2 includes n scanning signal lines G1 to Gn, m data signal lines S1 to Sm, and (m×n) pixel circuits Pij. The scanning signal lines G1 to Gn are arranged in parallel to one another, and the data signal lines S1 to Sm are arranged in parallel to one another and perpendicular to the scanning signal lines G1 to Gn. A pixel circuit Pij is arranged in the vicinity of the intersection of the scanning signal line Gi and the data signal line Sj. Thus, the (m×n) pixel circuits Pij are arranged in m rows and n columns to form a two-dimensional pattern (matrix pattern). The scanning signal line Gi is connected to all the pixel circuits Pij arranged in i-th row. The data signal line Sj is connected to all the pixel circuits Pij arranged in j-th column. A TFT (not shown) for a pixel is formed in each pixel circuit Pij as a switching element. Gate of the TFT for a pixel is connected to the scanning signal line Gi, drain of the TFT is connected to the data signal line Sj, and a source of the TFT for a pixel is connected to a pixel electrode (not shown).

Control signals such as a horizontal synchronizing signal HSYNC and a vertical synchronizing signal VSYNC, and display data DT are fed from outside the liquid crystal display device of the present embodiment. Based on such signals, the display-control circuit 3 feeds clock signals CK1 and CK2 and a start pulse SP into the gate driver 4 and feeds a control signal SC and a display data DT into the source driver 5.

The gate driver 4 includes n shift registers 1. The shift registers 1 control output signals individually and sequentially from SROUT1 to SROUTn in high level (a selected state), based on the clock signals CK1 and CK2. The output signals SROUT1 to SROUTn are fed into the scanning signal lines G1 to Gn, respectively. Thereby, the scanning signal lines are selected individually and sequentially from G1 to Gn, and thereby pixel circuits Pij arranged in one row are selected at a time.

The source driver 5 applies a voltage depending on the display data DT to each of the data signal lines S1 to Sm based on the control signal SC and the display data DT. Thereby, the voltage depending on the display data DT is written in the selected pixel circuits Pij arranged in one row. Thus, the liquid crystal display device 100 displays an image.

Figure 5:
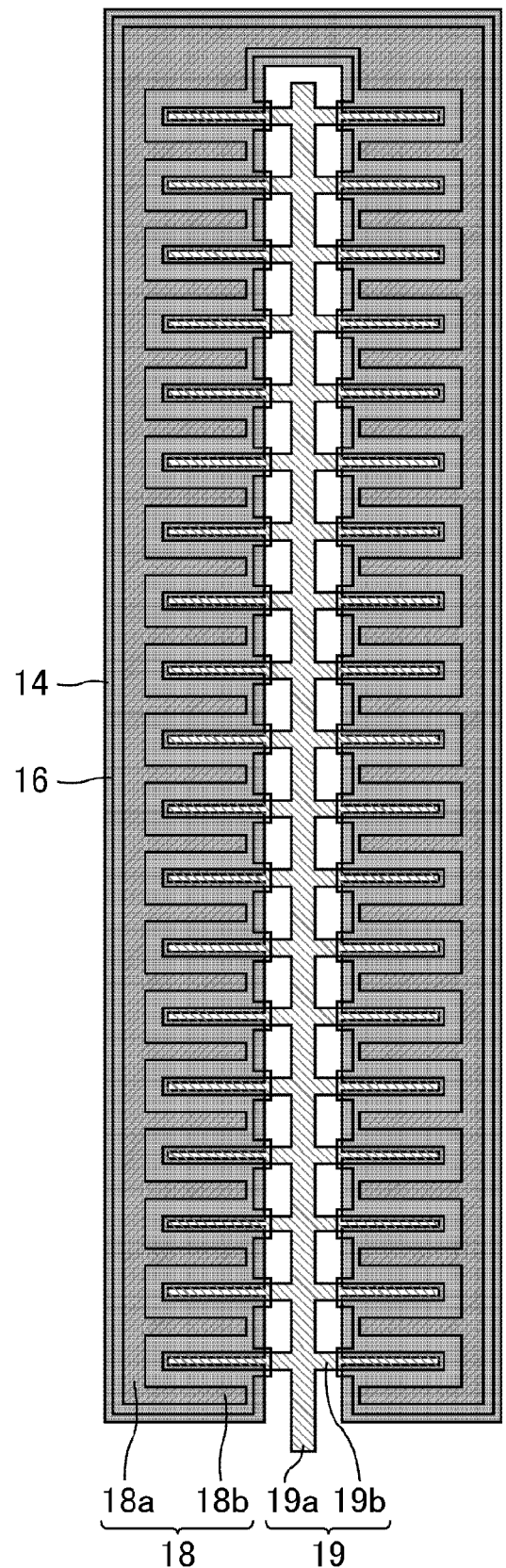
FIG. 5 is a plan view schematically showing a configuration of a TFT of Embodiment 1.
Figure 6:
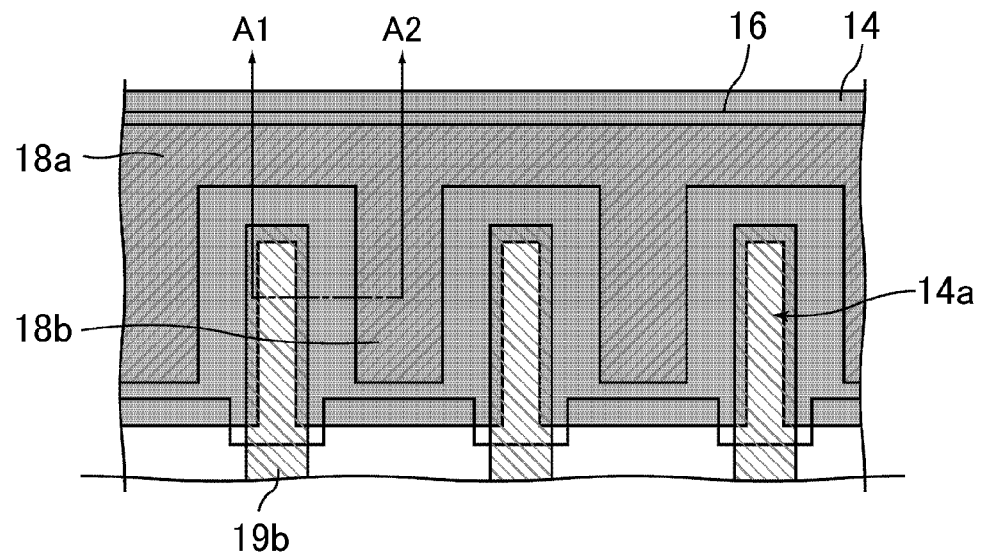
FIG. 6 is an enlarged view of FIG. 5.
Figure 7:
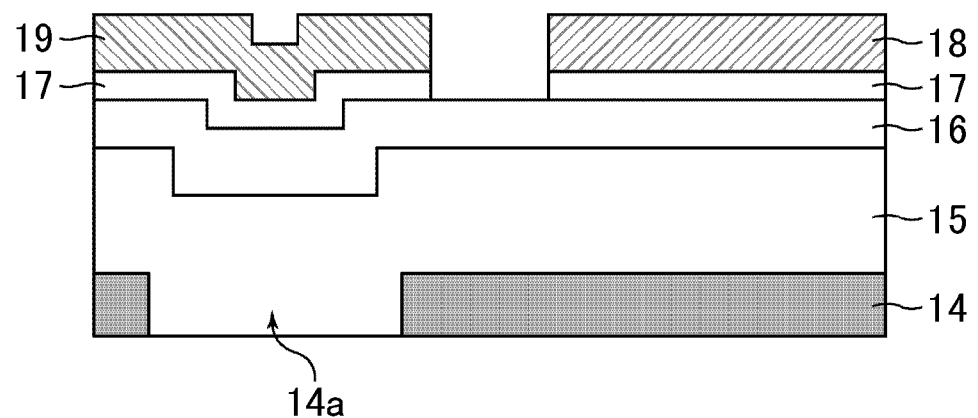
FIG. 7 is a cross-sectional view taken along the line A1-A2 in FIG. 6.

FIGS. 5 to 7 each show a configuration of the transistor 11*a* (output transistor).

The transistor 11*a* is a bottom gate thin-film transistor having a comb-shaped source/drain structure, as shown in FIG. 5. The channel width in one transistor is set to several millimeters to several centimeters, and the channel length in one transistor is set to several micrometers to tens of micrometers in one transistor.

As shown in FIG. 7, a gate electrode 14 formed of a metal material, a gate insulating film 15 formed of a silicon-containing insulating film such as SiN, an i layer 16 (semiconductor active layer) formed of amorphous silicon, a n+ layer 17 formed of amorphous silicon which contains impurities (for example, phosphorus), a source electrode 18 and a drain electrode 19 that are formed of a metal material are stacked in this order on a transparent insulating substrate (not shown) such as a glass substrate.

The TFT for a pixel is a bottom gate thin-film transistor similarly to the TFT included in the shift register 1. The gate electrode 14 is formed of the same metal material as the gate electrode of the TFT for a pixel. The gate insulating film 15 is formed of the same insulating material as the gate insulating film of the TFT for a pixel. The i layer 16 is formed of the same semiconductor material as the i layer of the TFT for a pixel. The n+ layer 17 is formed of the same material as the n+ layer of the TFT for a pixel. The source electrode 18 and the drain electrode 19 are formed of the same metal material as the source electrode and the drain electrode of the TFT for a pixel.

As shown in FIG. 5, the gate electrode 14 is formed in a squared U-shape when viewed in plan. The gate insulating film 15 is uniformly formed so as to cover the gate electrode 14. The i layer 16 is formed in a squared U-shape when viewed in plan, similarly to the gate electrode 14. Although a large portion of the i layer 16 is disposed within an area where the gate electrode 14 is formed, the i layer 16 partly projects from an area where the gate electrode 14 is formed and overlaps drain branch portions 19*b*. The n+ layer 17 is formed in an area where the i layer 16 overlaps the source electrode 18 or an area where the i layer 16 overlaps the drain electrode 19. The n+ layer 17 makes Ohmic connections between the i layer 16 and the source electrode 18 and between the i layer 16 and the drain electrode 19.

The source electrode 18 and the drain electrode 19 each are shaped like a comb when viewed in plan. Specifically, the source electrode 18 includes a source trunk portion 18*a* and a plurality of source branch portions 18*b* that are branched from the trunk portion 18*a* and correspond to teeth of a comb. The source trunk portion 18*a* is formed in a squared U-shape when viewed in plan within an area overlapping with the gate electrode 14, and arranged along the outer edge of the gate electrode 14. Each source branch portion 18*b* is shaped like a straight line when viewed in plan within an area overlapping with the gate electrode 14. The source branch portions 18*b* extend in parallel to one another from the source trunk portion 18*a* toward a space at the center of the gate electrode 14.

The drain electrode 19 includes a drain trunk portion 19*a* and a plurality of drain branch portions 19*b* that are branched from the drain trunk portion 19*a* and correspond to teeth of a comb. The drain trunk portion 19*a* is shaped like a straight line when viewed in plan, and disposed at a space at the center of the gate electrode 14 so as not to overlap the gate electrode 14. The drain branch portion 19*b* is shaped like a straight line when viewed in plan, and extend in parallel to one another from the drain trunk portion 19*a* toward a space between the source branch portions 18*b*.

Thus, the source electrode 18 and the drain electrode 19 are disposed to face each other, and each source branch portion 18*b* and each drain trunk portion 19*a* are alternately arranged.

Figure 8:
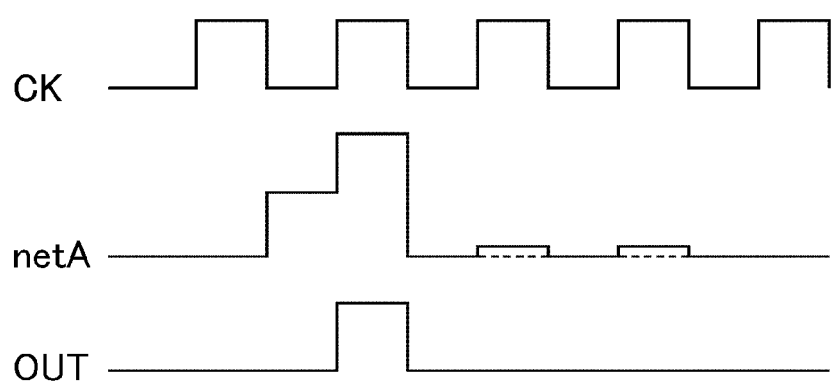
FIG. 8 is a timing chart of the shift register of Embodiment 1.

As shown in FIGS. 5 and 6, the gate electrode 14 has cuts 14a in a region overlapping with the drain branch portions 19b. Thereby, parasitic capacitance 13 generated between the gate electrode 14 and the drain electrode 19 can be effectively reduced. Accordingly, as shown in FIG. 8, when the transistor 11a is in an OFF state, the potential of the node netA can be suppressed from undulating in response to change in potential of the clock signal CK. As a result, the operation of the shift register 1 can be stabilized.

On the other hand, parasitic capacitance generated between the gate electrode 14 and the source electrode 18 may function as capacitance which contributes to a bootstrap effect, i.e., capacitance 12. Accordingly, the gate electrode 14 has no cut in a region overlapping with the source electrode 18.

Figure 9:
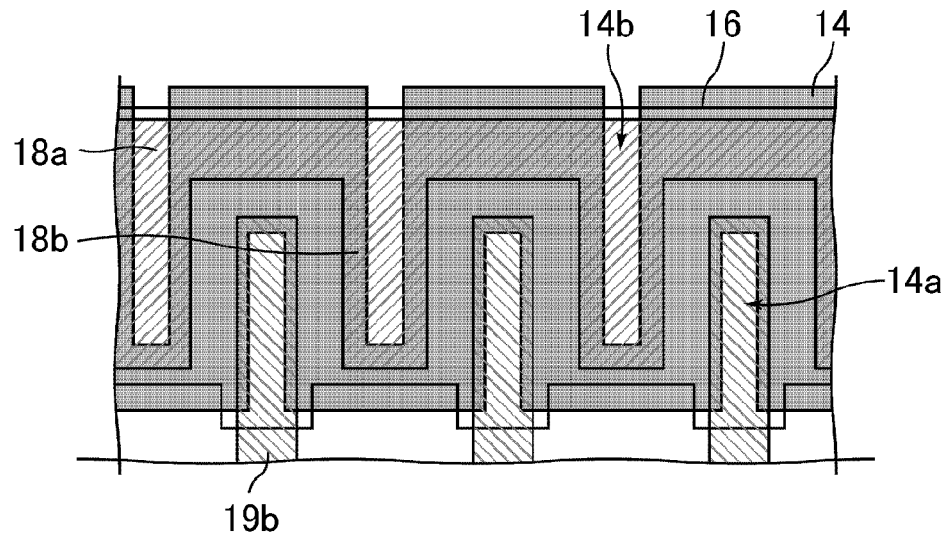
FIG. 9 is a plan view schematically showing a configuration of the TFT of Embodiment 1.
Figure 10:
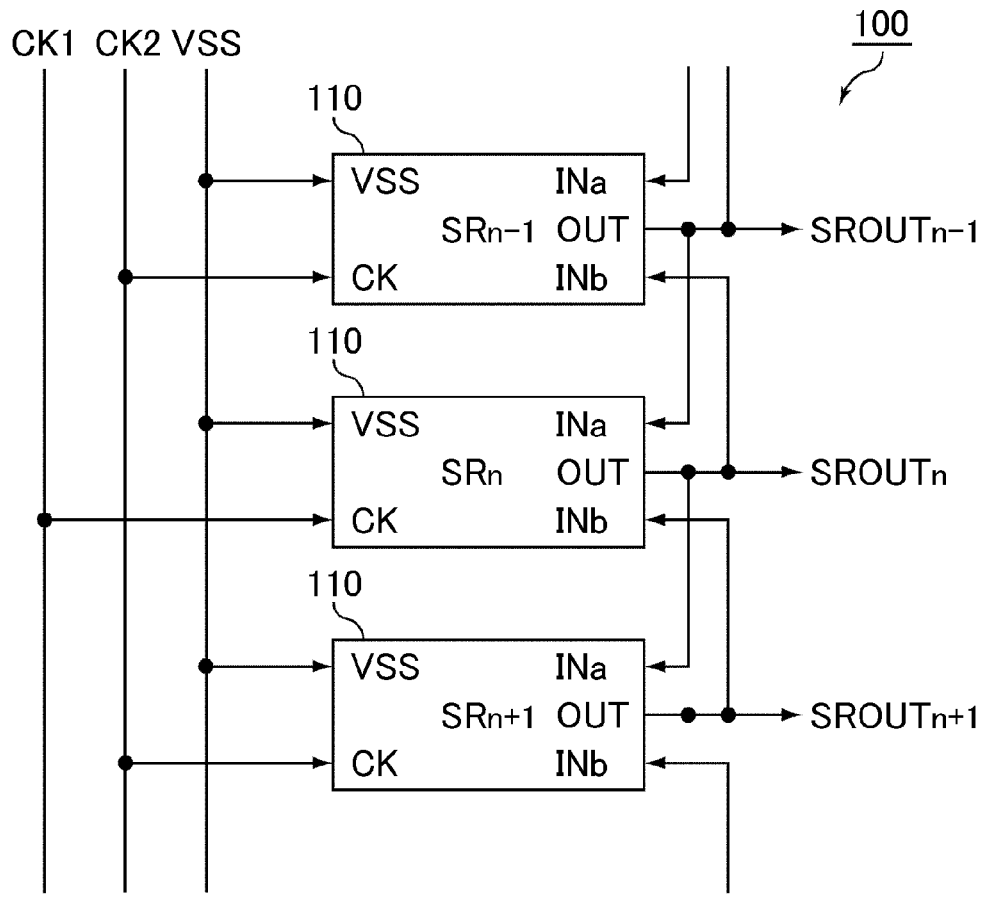
FIG. 10 is a block diagram showing a configuration of a conventional shift register.
Figure 11:
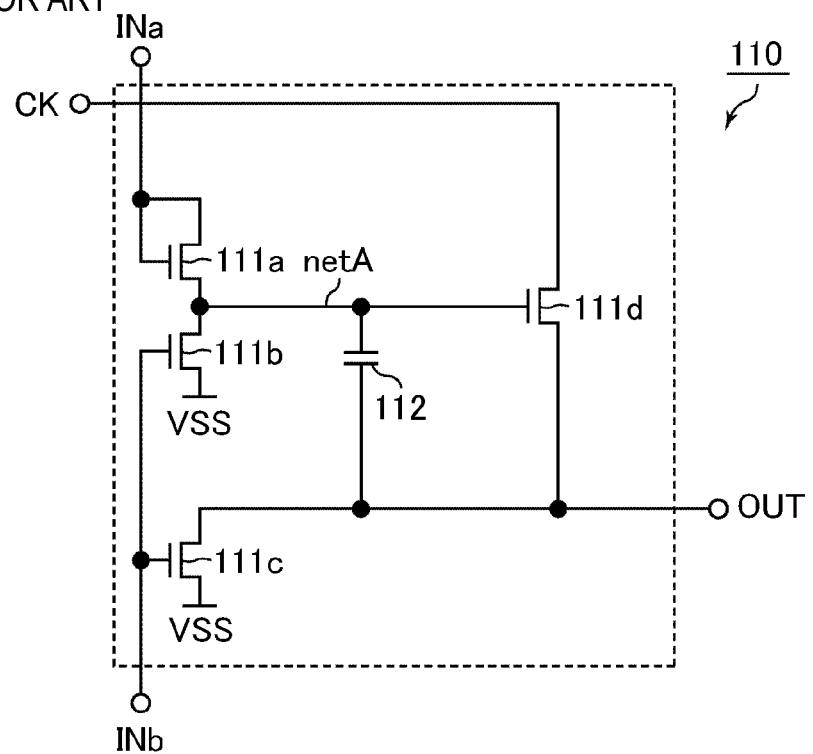
FIG. 11 is a circuit diagram of a unit circuit included in the conventional shift register.
Figure 12:
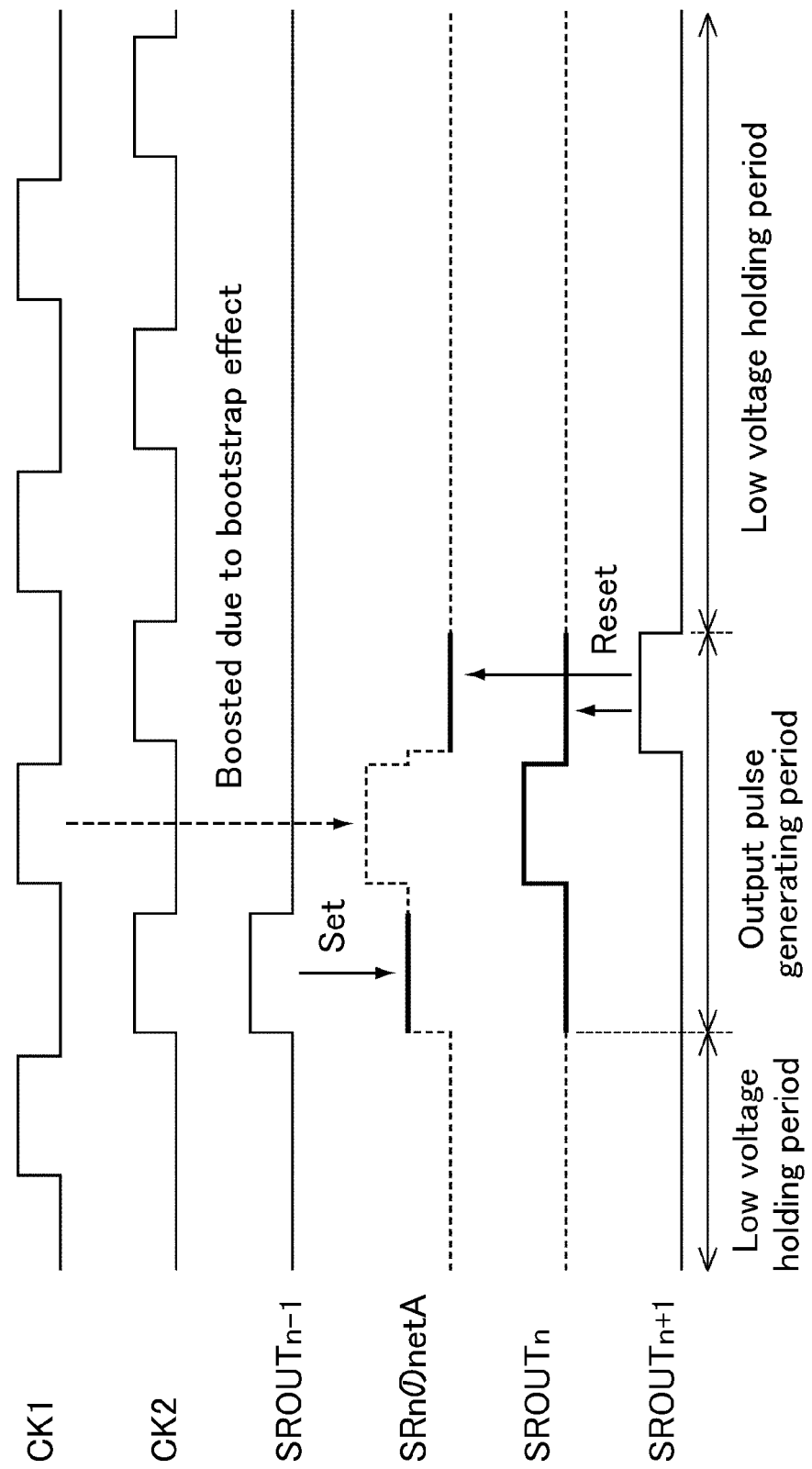
FIG. 12 is a timing chart of the conventional shift register.
Figure 13:
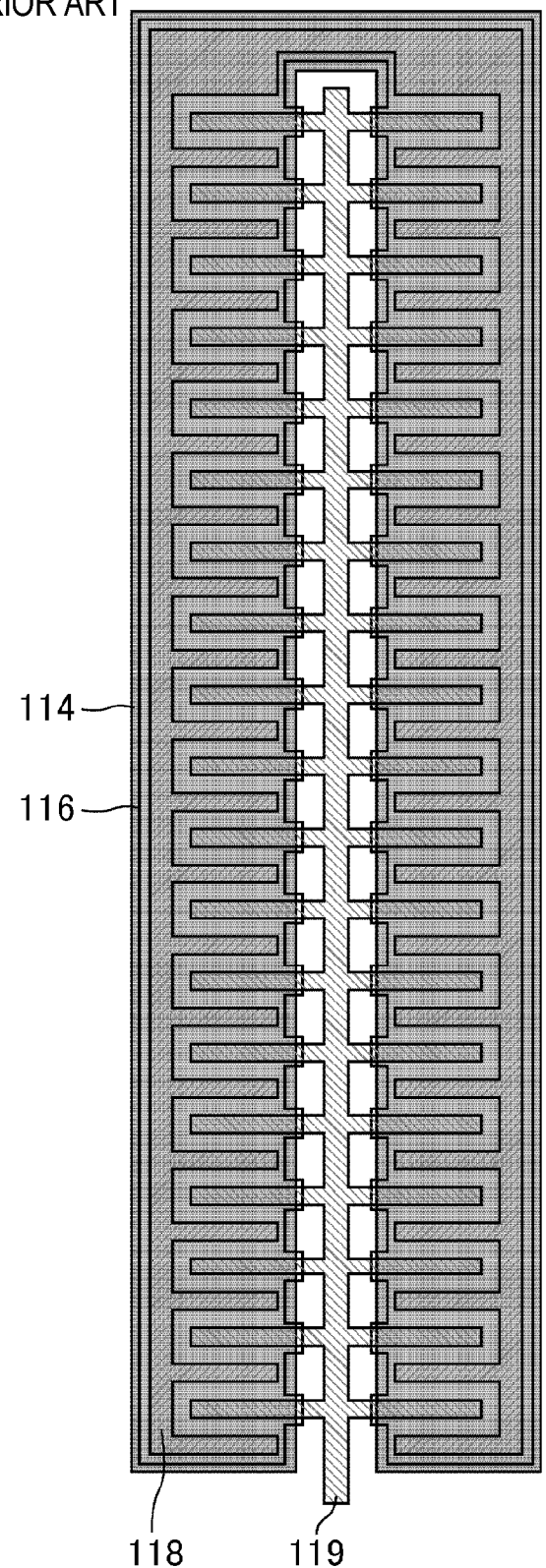
FIG. 13 is a plan view schematically showing a configuration of a conventional TFT.
Figure 14:
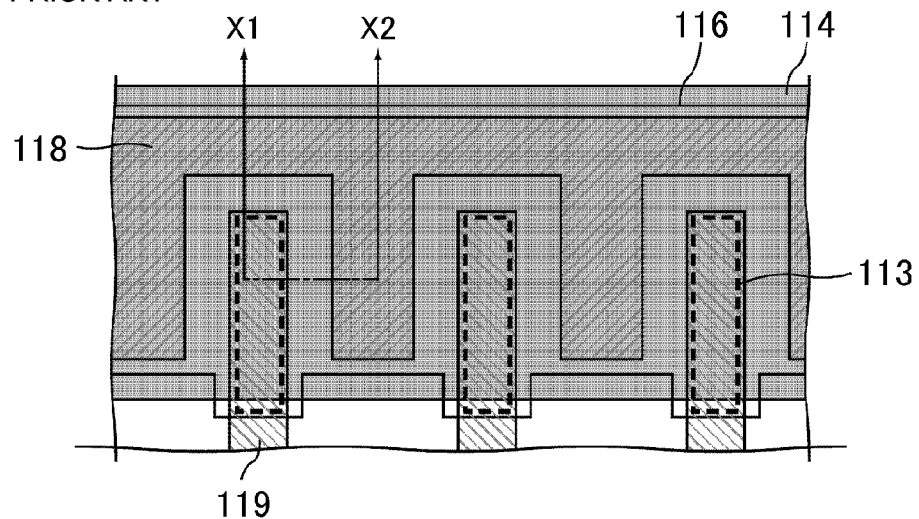
FIG. 14 is an enlarged view of FIG. 13.
Figure 15:
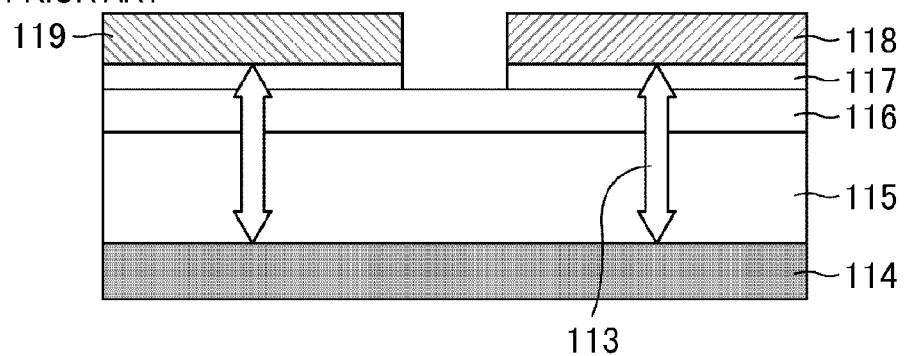
FIG. 15 is a cross-sectional view taken along the line X1-X2 in FIG. 14.
Figure 16:
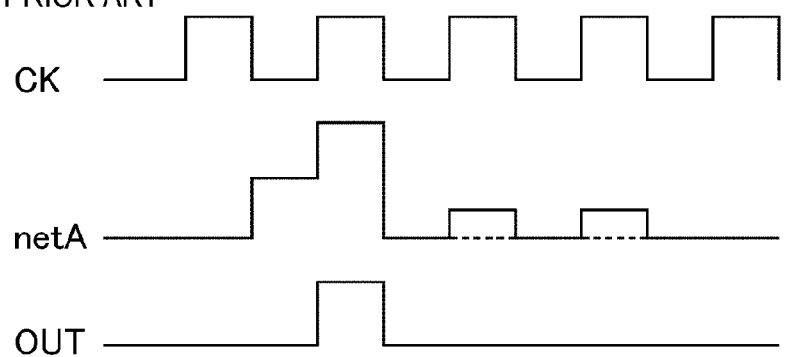
FIG. 16 is a timing chart of the conventional shift register.

FIG. 9 shows a configuration of the transistor 11b and sink-down transistors (transistors 11c to 11j).

These transistors each have a structure different from that of the transistor 11a (output transistor). In each transistor, the gate electrode 14 has cuts 14b also within an area overlapping with the source branch portions 18b. Thereby, in addition to the parasitic capacitance generated between the gate electrode 14 and the drain electrode 19, parasitic capacitance generated between the gate electrode 14 and the source electrode 18 can be effectively reduced. Accordingly, malfunctions in operation in the sink-down transistors due to the parasitic capacitance can be effectively suppressed. Further, output shortage resulting from slow initial rise in potential of the node netA and occurrence of electric discharge through the transistor 11b, which are caused by the parasitic capacitance of the transistor 11b, can be suppressed.

According to the present embodiment, when the output transistor is in an OFF state, the potential of the node netA can be suppressed from undulating in response to change in potential of the clock signal CK. Further, the sink-down transistors and the transistor 11b can favorably operate. As a result, the operation of the shift register 1 can be stabilized.

Embodiment 1 shows the liquid crystal display device, but the display device of the present invention is not particularly limited thereto as long as the display device includes a shift register having a TFT. Examples of the display device of the present invention include an organic or inorganic EL display and a plasma display.

Figure 17:
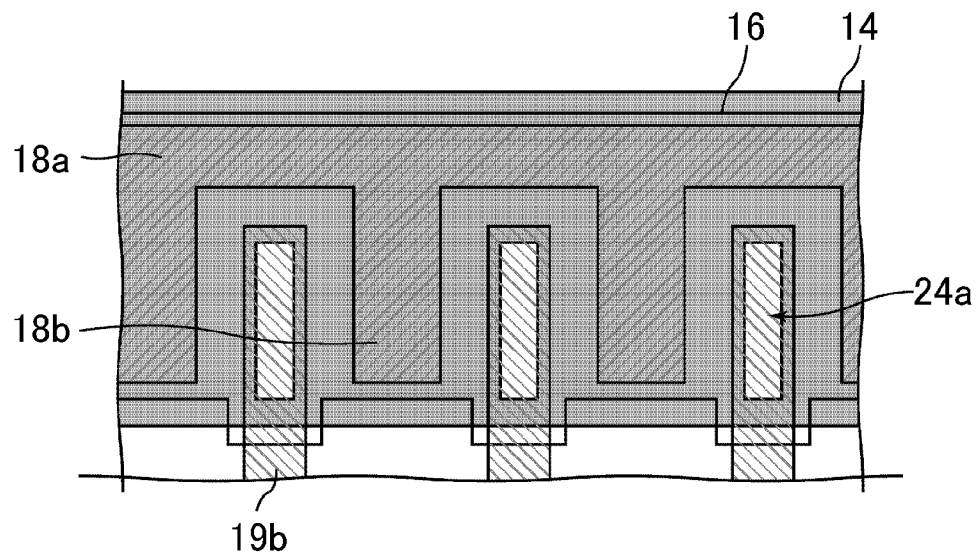
FIG. 17 is a plan view schematically showing a configuration of the TFT of Embodiment 1.

In the transistor 11a, as shown in FIG. 17, the gate electrode 14 may be provided with openings 24a instead of the cuts 14a in a region overlapping with the drain branch portions 19b.

Figure 18:
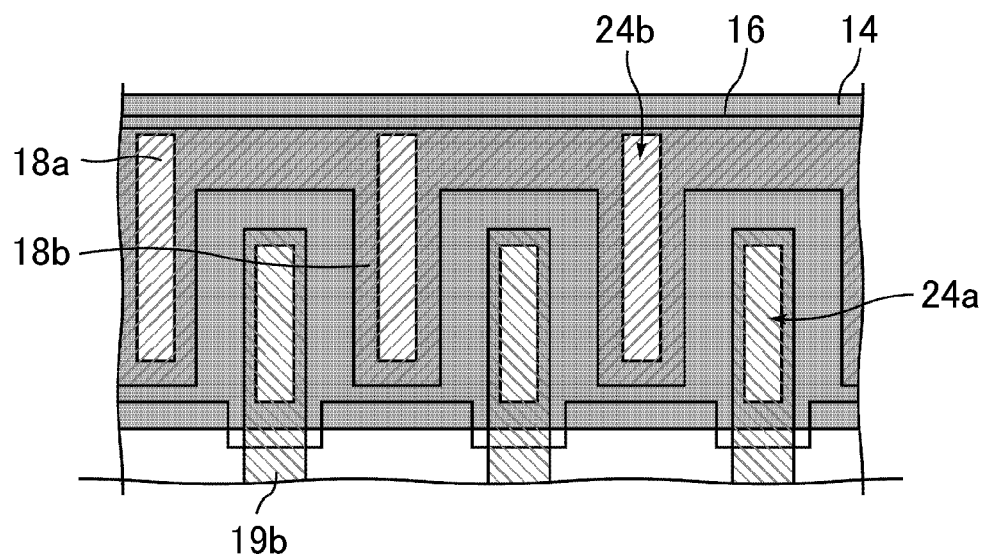
FIG. 18 is a plan view schematically showing a configuration of the TFT of Embodiment 1.

Similarly, in the transistor 11b and the sink-down transistors (transistors 11c to 11j), as shown in FIG. 18, the gate electrode 14 may be provided with openings 24a instead of the cuts 14a in an area overlapping with the drain branch portions 19b. Further, the gate electrode 14 may be provided with openings 24b instead of the cuts 14b in an area overlapping with the source electrode 18.

Such embodiments achieve a reduction in parasitic capacitance and prevention of an increase in wiring resistance. Of course, both the cuts and the openings may exist in each transistor.

The shape of the gate electrode 14 viewed in plan is not particularly limited to a squared U-shape, and may be, for example, a rectangle or an L shape.

The source branch portions 18b may not be perpendicular to the source trunk portion 18a. The drain branch portions 19b may not be perpendicular to the drain trunk portion 19a. The angle between each branched portion and each trunk portion may be optionally set.

The semiconductor material is not particularly limited to amorphous silicon. Examples of the semiconductor material include polycrystalline silicon, CG silicon, and microcrystal silicon (μc-Si: microcrystal silicon). Particularly in a TFT made of amorphous silicon, a comb-shaped source/drain structure is advantageously used because a channel width can be increased to improve a drive ability. On the other hand, the source/drain structure that is shaped like teeth of a comb is likely to increase parasitic capacitance. In the case where the TFT of the present invention is prepared using amorphous silicon, a remarkable reduction in parasitic capacitance can be achieved. Thereby, the yield of the shift register can be remarkably increased and costs can be remarkably reduced.

The present application claims priority to Patent Application No. 2009-267938 filed in Japan on Nov. 25, 2009 under the Paris Convention and provisions of national law in a designated State, the entire contents of which are hereby incorporated by reference.

REFERENCE SIGNS LIST

1: Shift register
2: Pixel array
3: Display-control circuit
4: Gate driver
5: Source driver
10: Unit circuit
11a to 11j: Transistor
12, 13: Capacitance
14: Gate electrode
14a, 14b: Cut
15: Gate insulating film
16: i Layer
17: n+ Layer
18: Source electrode
18a: Source trunk portion
18b: Source branch portion
19: Drain electrode
19a: Drain trunk portion
19b: Drain branch portion
24a, 24b: Opening

The invention claimed is:
1. A shift register, comprising:
cascade-connected unit circuits, each of which includes a thin-film transistor which includes a source electrode, a drain electrode, and a gate electrode, wherein
the thin-film transistor is a bottom gate thin-film transistor which includes a comb-shaped source/drain structure,
the source electrode includes a source trunk portion and a plurality of source branch portions which are branched from the source trunk portion and which correspond to teeth of a comb,
the drain electrode includes a drain trunk portion and a plurality of drain branch portions which are branched from the drain trunk portion and which correspond to teeth of a comb,
the source electrode and the drain electrode face each other,
the plurality of source branch portions and the plurality of drain branch portions are alternatingly arranged,
the gate electrode is provided with at least one of a cut and an opening in at least one of a region overlapping with the source electrode and a region overlapping with the drain electrode, and
the at least one of the cut and the opening faces at least one of the plurality of source branch portions and the plurality of drain branch portions.

2. The shift register according to claim 1,
wherein the cascade-connected unit circuits each include a clock terminal into which a clock signal is fed and an output terminal through which an output signal is sent out, and
the shift register includes an output transistor disposed between the clock terminal and the output terminal, the output transistor switching passage and cutout of the clock signal according to a gate potential.

3. The shift register according to claim 2,
wherein the thin-film transistor is the output transistor, and
the at least one of a cut and an opening is defined in a region overlapping with one electrode connected to the clock terminal, the one electrode being selected from the source electrode and the drain electrode.

4. The shift register according to claim 3,
wherein the gate electrode is provided with no cut and no opening in a region overlapping with one electrode selected from the source electrode and the drain electrode, the one electrode being connected to the output terminal.

5. The shift register according to claim 2,
wherein the thin-film transistor is a transistor arranged to apply a low level voltage to the output terminal at times other than a time of sending of the output signal, and
the at least one of a cut and an opening is defined in a region overlapping with the source electrode and a region overlapping with the drain electrode.

6. The shift register according to claim 2,
wherein the thin-film transistor is a transistor arranged to apply a low level voltage to a node connected to a gate of the output transistor during a period other than a period for turning the output transistor ON, and
the at least one of a cut and an opening is defined in a region overlapping with the source electrode and a region overlapping with the drain electrode.

7. The shift register according to claim 2,
wherein the shift register includes a first transistor in which source or drain is connected to the gate of the output transistor,
the thin-film transistor is a transistor arranged to apply a low level voltage to a node connected to a gate of the first transistor during a period for turning the output transistor ON, and
the at least one of a cut and an opening is defined in a region overlapping with the source electrode and a region overlapping with the drain electrode.

8. The shift register according to claim 2,
wherein the cascade-connected unit circuits each include an input terminal into which a start pulse is fed or an output signal is fed from the previous circuit,
the thin-film transistor is a transistor in which one of a source and a drain is connected to the gate of the output transistor and a gate and the other of the source and the drain are connected to the input terminal,
the at least one of a cut and an opening is defined in a region overlapping with the source electrode and a region overlapping with the drain electrode.

9. The shift register according to claim 1,
wherein the thin-film transistor is made of amorphous silicon.

10. A display device, comprising:
a plurality of pixel circuits arranged in a matrix pattern; and
a driver including the shift register according to claim 1.

* * * * *